United States Patent [19]
Chantraine et al.

[11] Patent Number: 5,231,757
[45] Date of Patent: Aug. 3, 1993

[54] METHOD FOR FORMING THE MULTI-LAYER STRUCTURE OF A CONNECTION BOARD OF AT LEAST ONE VERY LARGE SCALE INTEGRATED CIRCUIT

[75] Inventors: Philippe Chantraine, Neuilly-sur-Seine; Marta Zorrilla, Fontenay-le-Fleury, both of France

[73] Assignee: Bull, S.A., Paris, France

[21] Appl. No.: 556,487

[22] Filed: Jul. 24, 1990

[30] Foreign Application Priority Data

Jul. 27, 1989 [FR] France .................. 89 10157

[51] Int. Cl.⁵ .................................. H01K 3/10
[52] U.S. Cl. .................................. 29/852; 156/643; 156/644; 174/258; 205/125
[58] Field of Search ............. 29/830, 852, 846, 847, 29/600; 361/400, 410, 413, 414; 174/258; 156/643, 644; 205/125

[56] References Cited

U.S. PATENT DOCUMENTS

| | | | |
|---|---|---|---|
| Re. 29,284 | 6/1977 | Shaheen et al. | 29/847 X |
| 3,311,966 | 4/1967 | Shaheen et al. | 29/847 |
| 3,352,730 | 11/1967 | Murch, Jr. | 29/846 |
| 4,673,773 | 6/1987 | Nakano et al. | 174/258 |
| 4,700,473 | 10/1987 | Freyman et al. | 29/830 X |
| 4,710,592 | 12/1987 | Kimbara | 361/414 X |
| 4,776,087 | 10/1988 | Cronin et al. | 29/600 X |
| 4,830,691 | 5/1989 | Kida et al. | 29/846 X |
| 4,963,697 | 10/1990 | Peterson et al. | 361/414 X |
| 4,984,132 | 1/1991 | Sakurai et al. | 361/410 X |

FOREIGN PATENT DOCUMENTS

| | | | |
|---|---|---|---|
| 2133156 | 11/1972 | France . | |
| 2622384 | 4/1989 | France . | |
| 1006498 | 10/1965 | United Kingdom | 29/830 |

OTHER PUBLICATIONS

IBM Technical Disclosure Bulletin, vol. 21, No. 4, Sep. 1978, pp. 1396-1397.
IBM Tech. Discl. Bull., vol. 10, No. 4, Sep. 1967, pp. 359-360 by Peter et al.

*Primary Examiner*—Carl J. Arbes
*Attorney, Agent, or Firm*—Kerkam, Stowell, Kondracki & Clarke

[57] ABSTRACT

Via studs (23) of the multi-layer structure (12) are formed on a uniform metal layer that is subsequently etched to form the conductors (17) of a conductive layer of the multi-layer structure.

6 Claims, 3 Drawing Sheets

METHOD FOR FORMING THE MULTI-LAYER STRUCTURE OF A CONNECTION BOARD OF AT LEAST ONE VERY LARGE SCALE INTEGRATED CIRCUIT

CROSS-REFERENCE TO RELATED APPLICATION

This application is related to our copending application, Case 3083, entitled "Method for Depositing an Insulating Layer on a Conductive Layer of the Multi-Layer Structure of a Connection Board of at Least One Very Large Scale Integrated Circuit", Ser. No. 556,488, now U.S. Pat. No. 5,082,718, filed on even data herewith in the names of Philippe Chantraine and Marta Zorrilla and which is assigned to the assignee of the present invention.

FIELD OF THE INVENTION

The invention relates to a method for forming the multi-layer structure of a connection board of at least one very large scale integrated circuit, or VLSI chip. The board may be used to interconnect several surface mounted integrated circuits, or simply to carry an integrated circuit located in a package, for example as a substitute for the conventional substrate commonly known as a chip carrier.

BACKGROUND OF THE INVENTION

In such a board, the multi-layer structure is ordinarily supported by a substrate made of an insulating slab that incorporates the distribution planes of the supply voltages of the integrated circuit or circuits. The substrate may be a slab of co-fired ceramic, or a slab made of some organic material, such as plastic. However, the board may be simply formed of the multi-layer structure, taking the form of a flexible board.

Alternatively, the board may be a slab of semiconductor material incorporating integrated circuits and covered with a multi-layer structure for interconnection of these integrated circuits by the WSI (wafer scale integration) technique. In all these boards, the multilayer structure comprises a stack of alternating conductive and insulating layers. In this stack, an insulating layer is pierced with via-holes for electrical connection of the adjacent conductive layers. The conductive layer is ordinarily made of aluminum or copper, and at present, the insulating layer is preferably made of a polymerized material such as polyimide.

One problem in manufacturing the multi-layer structure is how to obtain relatively planar layers. One conventional manufacturing method comprises forming the conductors of a conductive layer and covering the conductive layer with an insulating layer of polymerizable material in the form of viscous liquid, known in this field as paste. The paste has the advantage of having a surface area with steps or lower levels that are not as high as the corresponding edges of the conductors underneath. This method may comprise spreading a drop of polymerizable material by centrifugal force, or spray application of the paste, or making a coating of the paste, for example by serigraphy. The paste is then polymerized. Naturally this method is used under such conditions as to lend the polymerized layer the great thickness required to assure the desired insulating between two conductive layers one on top of the other. The insulating layer is covered with a mask that defines the location of the via-holes to be formed. In a conventional embodiment, the via-holes are flared, and the conductors of the upper conductive layer extend over both the insulating layer and the walls of the via-holes that have just been formed, as well as over the regions of the conductors making up the bottom of the via-holes. The result is an upper conductive layer with numerous depressions at the level of the via-holes. Understandably, stacking numerous layers accentuates the depth of the depressions and consequently entails the risk of creating discontinuities in the conductive layers deposited. Moreover, the formation and flaring of the via-holes are delicate steps in the method.

One improvement to this method comprises avoiding the superposition of via-holes by offsetting them in a spiral about a vertical line. A first disadvantage of this is that it reduces the density of the via-holes in the same insulating layer and consequently reduces the overall density of conductors in the multi-layer structure. A second advantage is that although the staggered disposition of the via-holes is quite fast, it limits the number of reliable layers in the structure. Disposing them in a spiral 90° from one another, for example, means that a via-hole in the fifth layer is superimposed on a via-hole of the first layer and undergoes the deformations occasioned by the four via-holes in between. In practice, this method is ordinarily limited to the deposition of about five superimposed conductive layers.

A more recent solution to the problem has been to form via studs on the conductors of a conductive layer and to cover all of this with a paste that is polymerized to obtain the insulating layer. The insulating layer has the great thickness required to assure the desired insulation between two superimposed conductive layers and covers the via studs with a lesser thickness of insulating material. The insulating layer is covered with a mask that has the configuration of the via-holes. Next, a selective attack of the insulating layer is performed to uncover the upper surfaces of the via studs and to flare the via-holes. Because of the via studs, these via-holes are markedly less deep than those obtained by the method described in the previous paragraph. The upper conductive layer is accordingly relatively more flattened. Thus this method has the advantage of stacking a greater number of reliable conductive layers in the multi-layer structure.

OBJECT AND SUMMARY OF THE INVENTION

The invention relates to this technology and introduces a method for forming a multi-layer structure provided with via studs for an integrated circuit connection board.

The method according to the invention for forming the multi-layer structure of a connection board of at least one very large scale integrated circuit, including the formation of via studs on the conductors of a layer of the network, is characterized in that it comprises forming the via studs on a uniform metal layer that is subsequently etched to make these conductors.

The characteristics and advantages of the invention will become apparent from the ensuing detailed description, given by way of example, taken in conjunction with the accompanying drawings.

DESCRIPTION OF THE PREFERRED EMBODIMENTS

Figure 1:
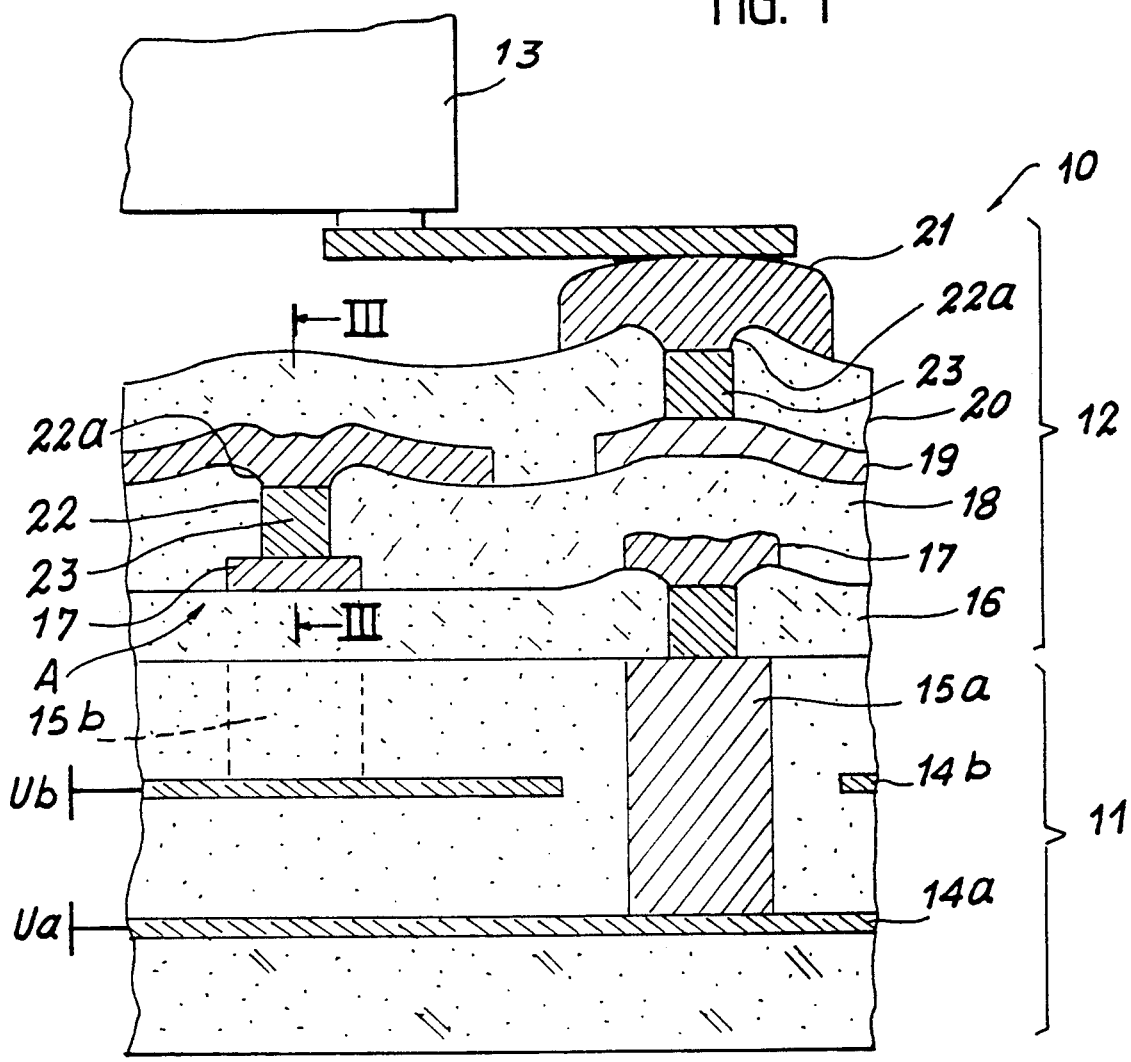
FIG. 1 is a fragmentary cross-sectional view of a multi-layer board made in accordance with the invention to carry at least one very large scale integrated circuit.

FIG. 1 shows a board 10 seen in fragmentary section, made by using the method according to the invention. The board 10 comprises a substrate 11 that on its surface carries a multi-layer structure 12 for connection of at least one integrated circuit 13. The substrate 11 is a solid slab made from an electrically insulating material, in the example shown ceramic, incorporating conductor planes 14a, 14b for distributing the respective potentials Ua, Ub for supplying the integrated circuit 13. Numerous conductor via studs 15a, 15b pass through the substrate 11, making contact with the respective potential planes and emerging on the same face of the substrate 11. The multi-layer structure 12 is formed on this face of the substrate 11 and comprises a stack of alternating conductive and insulating layers. The structure 12 shown includes a first insulating layer 16, a first conductive layer 17, a second insulating layer 18, a second conductive layer 19, a third insulating layer 20, and a conductive assembly layer 21 made of zones for connection of the integrated circuit 13. In an actual example, the ceramic substrate 11 was a slab measuring 100 mm by 100×and approximately 1 mm in thickness. The structure 12 was made of copper and polyimide. Each conductive layer had a thickness of approximately 5 micrometers, and was composed of conductors 50 μm in width aligned at intervals of 100 μm. Each insulating layer had a thickness on the order of 15 μm on top of the insulating layer beneath it. Although the upper face of the ceramic substrate 11 is insulating, it has numerous areas of roughness and defects in planarity, which are masked by depositing the first insulating layer 16. In the conventional manner, the insulating layers 16, 18, 20 are provided with via-holes 22 containing via studs 23 for the electrical connection of the adjacent conductive layers 17, 19 and 21 both to one another and to the via studs 15a, 15b. The via-holes 22 have flared edges 22a above the via studs 23. The via studs 23 may have a cylindrical or prismatic cross section. The via studs 23 made here were octagonal and had a diameter of 30 μm and a height of 10 μm above the conductors.

FIGS. 2A-2H, respectively, like FIGS. 3A-3H seen in a perpendicular plane, illustrate the successive phases of a method according to the invention for manufacturing the board 10 shown in FIG. 1. FIGS. 2A-2H and 3A-3H are views on a larger scale taken in a section at the level of region A shown in FIG. 1, and successively illustrate the formation of the conductive layer 17 on the insulating layer 16, of via studs 23 placed on the conductive layer 17, and of the insulating layer 18. The method illustrated begins after the formation of the insulating layer 16.

Figure 2A:
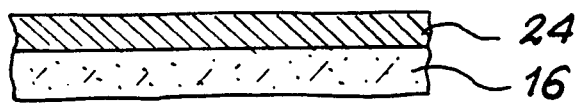
FIGS. 2A-2H are detailed views on a larger scale of the region A of the board shown in FIG. 1, illustrating the successive phases of a method according to the invention for manufacture of the board.
Figure 2B:
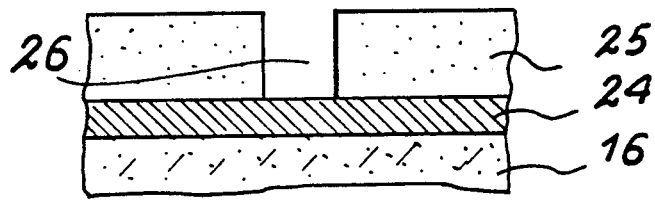
Figure 2C:
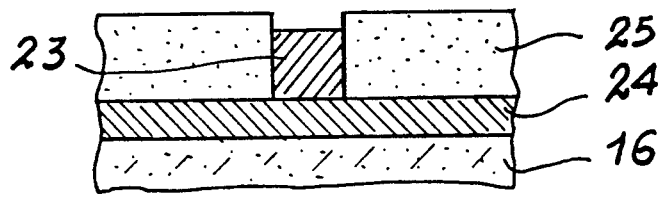
Figure 2D:
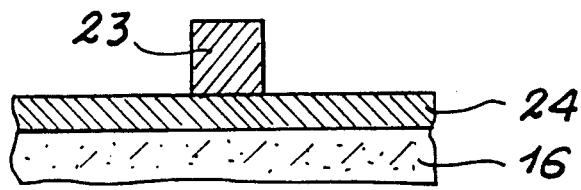
Figure 2E:
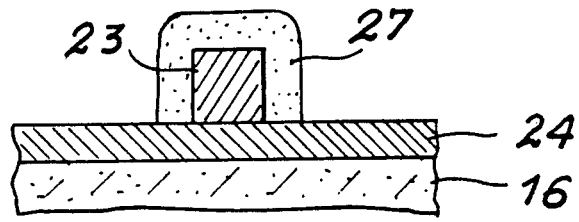
Figure 2F:
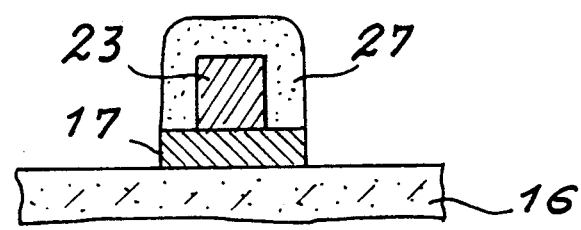
Figure 2G:
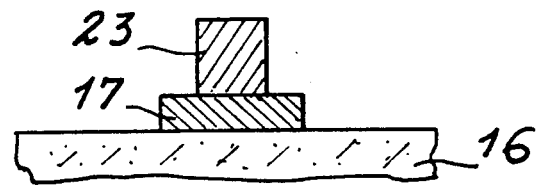
Figure 2H:
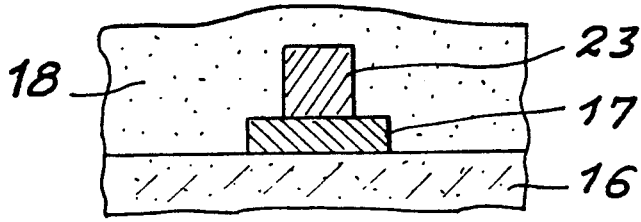
Figure 3:
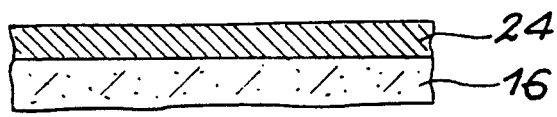
FIGS. 3A-3H are sectional views taken along the line III—III of the region A of the board shown in FIG. 1, respectively showing the successive phases corresponding to FIGS. 2A-2H of the method according to the invention.
Figure 3:
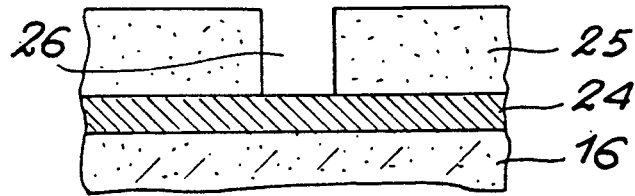
Figure 3:
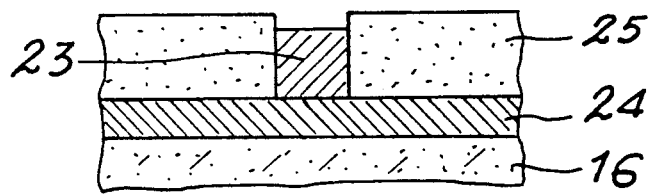
Figure 3:
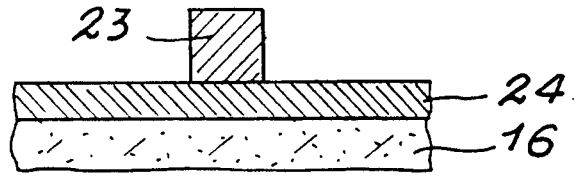
Figure 3:
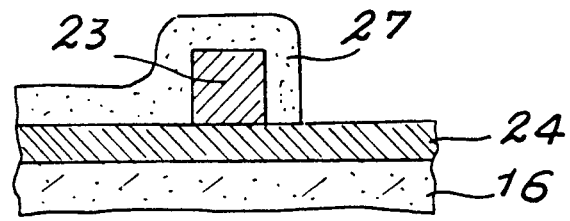
Figure 3:
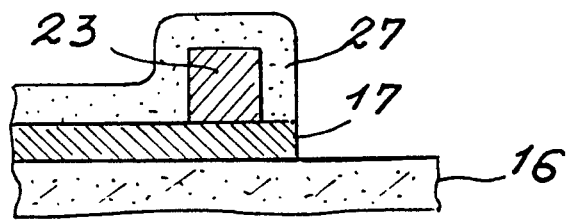
Figure 3:
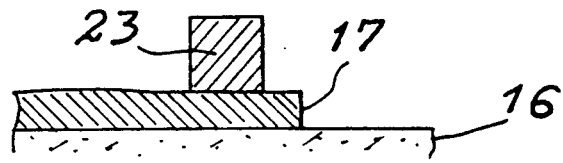
Figure 3:
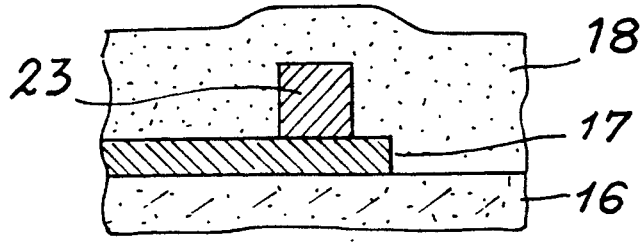

The insulating layer 16 is uniformly covered with a layer of copper 24 having the thickness of the conductive layer 17 to be formed (FIGS. 2A and 3A). The layer 24 has advantageously been deposited by a process of magnetron cathode atomization. The layer 24 is then covered uniformly with a photosensitive mask 2 treated to have via-holes 26 conforming to the pattern of via studs 23 (FIGS. 2B and 3B). The uniform layer of copper 24 thus serves as an electrode for the electrolytic deposition of the via studs 23 in the via-holes 26 of the mask 25 (FIGS. 2C and 3C). The mask 25 is eliminated (FIGS. 2D and 3D) and replaced with another photosensitive mask 27 covering the via studs 23, and is treated to indicate the pattern of the conductors of the conductive layer 17 (FIGS. 2E and 3E). The conductive layer 17 is then etched (FIGS. 2F and 3F). The mask 27 covering the conductors of the layer 17 is then eliminated (FIGS. 2G and 3G).

The insulating layer 18 may be formed by various known methods. In the example shown, the well-known method comprising spreading a polyamic acid in viscous form by centrifugal force, and then polymerizing the layer obtained to make it a polyimide, has been used. The result is the polyimide layer 18 shown in FIGS. 2H and 3H. This method has the advantage of substantially smoothing the relief of the conductors of the layer 17 provided with the via studs 23. By this method, the layer 18 leaves only a slight thickness of polyimide above each via stud 23, as shown in FIGS. 2 and 3H. The flared via-holes 22a of the insulating layer 18 shown in FIG. 1 were obtained conventionally by formation of a mask on the layer 18 shown in FIGS. 2H and 3H and by selective plasma attack, exposing the upper faces of the via studs 23. It will be noted that the via-holes 22a have a slight thickness and that they do not deform the upper conductive layer 19 very much.

Figure 4:
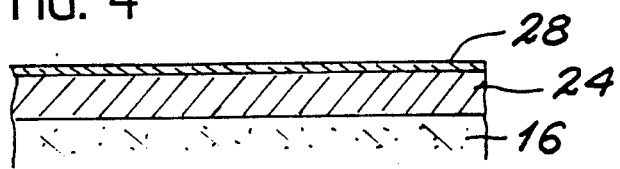
FIG. 4 is a sectional view similar to that of FIGS. 2A-2H, illustrating a phase of a variant method of the invention.

Various variants of the method that has just been described are possible. For example, the copper layer 24 may be made by any known method. Moreover, as material comprising the conductive layers 17, 19, 21 and via studs 23, instead of the copper it is possible to use any other conductive metal, either pure or in combination with other ingredients, suitable for electrolytic deposition of the via studs 23 and formed in the form of a layer 24 by any known method. It is also possible, however, that the nature of the material comprising the conductors of the layer 17 may not permit the electrolytic deposition of the via studs 23. This is the case if the conductors 17 are of aluminum, for example. In that case, FIG. 4 shows a view similar to that of FIGS. 2A-2H illustrating a supplementary step in the method shown. Thus in FIG. 2A, it is assumed that the metal layer 24 is of aluminum. In FIG. 4, the layer 24 is covered with a conductive film 28, for example of copper, enabling the electrolytic deposition of copper via studs 23 and optionally enabling compatibility with the aluminum. After deposition of the mask 25 (FIG. 2B), the copper via studs 23 are then formed. The film 28 is at least partly eliminated after the step shown in FIGS. 2D or 2E, to assure the electrical insulation between the conductors.

It is has also been seen that the insulating layer 18 could be made by various known methods. One advantageous method could for example comprise spreading a polyimide film about 30 μm in thickness over the conductive layer 17 provided with the via studs 23 (FIGS. 2G and 3G) and hot-pressing the film to obtain a structure analogous to that of FIGS. 2H and 3H. The thickness of polyimide above the via studs 23 may be reduced by mechanical erosion, or by chemical attack, or by plasma. It is understood that the polyimide is given by way of example, as an element currently used in multi-layer structures, and may be replaced with any other material adapted to the technology of multi-layer structures.

What is claimed is:

1. A method of forming a multilayer structure (12) of a connection board (10) for a very large scale integrated circuit (13), said multilayer structure comprising at least a layer of conductors (17) covered with an insulating layer (18) incorporating via studs (23), the method comprising:

forming a uniform conductive layer (24) of a metal having a thickness of said conductors to be formed;

then forming, on said conductive layer, a plurality of via studs (23) having upper faces, said via studs being made of the same metal as said uniform conductive layer;

then etching said uniform conductive layer to form said conductors; and forming, over said conductors, said insulating layer (18) having an upper surface exposing said upper faces of the via studs.

2. The method of claim 1, wherein said step of forming the via studs comprises forming a first mask (25), provided with via holes (26) matching the pattern of the via studs, over the uniform conductive layer, and filling the via holes with said metal.

3. The method of claim 2, wherein the via studs are formed by electrolytic deposition.

4. The method of claim 1, wherein said step of etching is preceded by a step of forming a second mask over the via studs and the uniform conductive layer, wherein said second mask (27) matches the pattern of said conductors.

5. A method of forming a multilayer structure (12) of a connection board (10) for a very large scale integrated circuit (13), said multilayer structure comprising at least a layer of conductors (17) covered with an insulating layer (18) incorporating via studs (23), the method comprising:

forming a uniform conductive layer (24) of a metal having a thickness of said conductors to be formed i the uniform conductive layer;

forming over the uniform conductive layer a first mask (25) provided with via holes (26) matching a pattern of said via studs;

filling the via holes with said metal to form on said uniform conductive layer said via studs (23) having upper faces;

eliminating the first mask;

forming over the uniform conductive layer and said via studs a second mask (27) matching the pattern of said conductors;

etching said conductive layer to form said conductors; and forming over said conductors said insulating layer (18) having an upper surface exposing said upper faces of the via studs.

6. The method of claim 5, wherein the via studs are formed by electrolytic deposition.

* * * * *

UNITED STATES PATENT AND TRADEMARK OFFICE
CERTIFICATE OF CORRECTION

PATENT NO. : 5,231,757
DATED : August 3, 1993
INVENTOR(S) : CHANTRAINE, et al

It is certified that error appears in the above-indentified patent and that said Letters Patent is hereby corrected as shown below:

Col. 6, line 14 (Claim 5, line 9) "i" should be -- in --.

Signed and Sealed this

Seventh Day of June, 1994

Attest:

BRUCE LEHMAN

*Attesting Officer*   *Commissioner of Patents and Trademarks*